United States Patent
Won et al.

(10) Patent No.: US 6,653,186 B2
(45) Date of Patent: Nov. 25, 2003

(54) METHODS OF FABRICATION INTEGRATED CIRCUIT CAPACITORS HAVING A DIELECTRIC LAYER BETWEEN A U-SHAPED LOWER ELECTRODE AND A SUPPORT LAYER

(75) Inventors: Seok-jun Won, Seoul (KR); Cha-young Yoo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 32 days.

(21) Appl. No.: 10/028,187

(22) Filed: Dec. 20, 2001

(65) Prior Publication Data
US 2002/0084471 A1 Jul. 4, 2002

(30) Foreign Application Priority Data
Dec. 26, 2000 (KR) .................................. 2000-82066

(51) Int. Cl.[7] .................................... H01L 21/8242
(52) U.S. Cl. ................................. 438/253; 438/396
(58) Field of Search ........................ 257/296, 300, 257/303, 304, 306, 310; 438/239, 244, 253, 254, 255, 387, 393, 396, 397, 398

(56) References Cited

U.S. PATENT DOCUMENTS

| | | | |
|---|---|---|---|
| 5,162,248 A | | 11/1992 | Dennison et al. ............ 438/396 |
| 5,336,917 A | * | 8/1994 | Kohyama ..................... 257/401 |
| 6,130,128 A | * | 10/2000 | Lin ............................. 438/253 |
| 6,187,625 B1 | * | 2/2001 | Lin et al. ..................... 438/253 |
| 6,271,083 B1 | * | 8/2001 | Lou ............................. 438/253 |
| 6,274,426 B1 | * | 8/2001 | Lee et al. .................... 438/253 |

FOREIGN PATENT DOCUMENTS

JP         10-50951         2/1998

* cited by examiner

Primary Examiner—Wael Fahmy
Assistant Examiner—Hoai Pham
(74) Attorney, Agent, or Firm—Myers Bigel Sibley & Sajovec

(57) ABSTRACT

Integrated circuit capacitors and methods of fabricating integrated circuit capacitors, according to the present invention, provide an electrically insulating electrode support layer having an opening therein, on an integrated circuit substrate. A U-shaped lower electrode is provided in the opening and a first capacitor dielectric layer extends on an inner surface and an outer portion of the U-shaped lower electrode. A second capacitor dielectric layer extends between the outer portion of the U-shaped lower electrode and the first capacitor dielectric and also extends between the outer portion of the U-shaped lower electrode and an inner sidewall of the opening. An upper electrode extends on the first dielectric layer.

9 Claims, 9 Drawing Sheets

METHODS OF FABRICATION INTEGRATED CIRCUIT CAPACITORS HAVING A DIELECTRIC LAYER BETWEEN A U-SHAPED LOWER ELECTRODE AND A SUPPORT LAYER

RELATED APPLICATION

This application is related to Korean Application No. 2000-82066, filed Dec. 26, 2000, the disclosure of which is hereby incorporated herein by reference.

FIELD OF THE INVENTION

The present invention relates to integrated circuit devices and related fabrication methods and, more particularly, to integrated circuit capacitors and methods of fabricating integrated circuit capacitors.

BACKGROUND OF THE INVENTION

Generally, it is useful to form three-dimensional capacitors having a cylindrical shape in order to improve capacitance. However, as the design rule of integrated circuit devices decreases to 0.2 μm or less, the use of cylindrical capacitors may present some problems.

Now referring to FIGS. 1 through 4, cross-sectional views of intermediate structures that illustrate a conventional method of fabricating integrated circuit capacitors will be described. As illustrated in FIG. 1, an insulating layer 13 is formed on an integrated circuit substrate 11, for example, a silicon substrate. The insulating layer 13 may include a silicon oxide layer. A titanium nitride (TiN) plug 15 is formed in the insulating layer 13. A lower mold layer 17 may be formed on the insulating layer 13 and the TiN plug 15. The lower mold layer 17 may be formed of silicon oxide. An etch stop layer 19 may be formed on the lower mold layer 17 and may be formed of silicon nitride. An upper mold layer 21 may be formed on the etch stop layer 19 and may be formed of silicon oxide.

Now referring to FIG. 2, a contact hole 22 may be formed by patterning the upper mold layer 21, the etch stop layer 19, and the lower mold layer 17 that exposes the TiN plug 15. A conductive layer 23 for a U-shaped lower electrode may be formed over the surface of the existing integrated circuit. The conductive layer 23 for the U-shaped lower electrode may be formed of, for example, metals of a platinum group, such as platinum (Pt), ruthenium (Ru), and iridium (Ir). A sacrificial layer 25 may be formed on the conductive layer 23 and may fill the contact hole 22. The sacrificial layer 25 may include, for example, a photoresist layer or a silicon oxide layer.

Now referring to FIG. 3, the sacrificial layer 25 and the U-shaped lower electrode 23 are etched using the surface of the upper mold layer 21 as an etch stop point. As illustrated in FIG. 4, a U-shaped lower electrode 23 of a capacitor is formed by removing the sacrificial layer 25 and the upper mold layer 21 using a wet etching method. A dielectric layer (not shown) and an upper electrode (not shown) may be formed over the entire surface of the integrated circuit device to complete the conventional integrated circuit capacitor. Conventional capacitors typically have poor adhesion between the lower electrode 23 and the etch stop layer pattern 19 when the upper mold layer 21 is removed. Consequently, an oxide etchant used to remove the upper mold layer 21 may penetrate into the lower mold layer 17 as illustrated by the arrows in FIG. 4. This penetration may cause the lower mold layer 17 and the insulating layer 13 to be damaged. The possible damage to the lower mold pattern 17 is illustrated by reference numeral 27 in FIG. 4.

SUMMARY OF THE INVENTION

Integrated circuits, according to embodiments of the present invention, Provide an electrically insulating electrode support layer having an opening therein, on an integrated circuit substrate. A U-shaped lower electrode is provided in the opening and a first capacitor dielectric layer extends on an inner surface and an outer portion of the U-shaped lower electrode. A second capacitor dielectric layer extends between the outer portion of the U-shaped lower electrode and the first capacitor dielectric and also extends between the outer portion of the U-shaped lower electrode and an inner sidewall of the opening. An upper electrode extends on the first dielectric layer.

In further embodiments of the present invention the second capacitor dielectric layer does not extend on the inner surface of the U-shaped lower electrode. The electrically insulating electrode support layer may include a mold layer on the integrated circuit substrate and an etch stop layer on the mold layer. The mold layer may include silicon oxide and the etch stop layer may include at least one of silicon nitride and/or tantalum oxide.

In some embodiments of the present invention, the first capacitor dielectric layer may further extend onto the support layer. The first capacitor dielectric layer may include a tantalum oxide, aluminum oxide ($Al_2O_3$), and/or Hafnium Oxide ($HfO_2$). The second capacitor dielectric layer may include a dielectric material that is not etched by and oxide etchant.

Still further embodiments of the present invention provide methods of fabricating integrated circuit capacitors that include the steps of forming an electrically insulating electrode support layer having an opening therein, on an integrated circuit substrate. The method further includes forming a U-shaped lower electrode in the opening and forming a first capacitor dielectric layer extending on an inner surface and outer portion of the U-shaped lower electrode. A second capacitor dielectric layer is formed extending between the outer portion of the U-shaped lower electrode and the first capacitor dielectric and also extending between the outer portion of the U-shaped lower electrode and an inner sidewall of the opening. An upper electrode is formed on the first capacitor dielectric layer.

In some embodiments of the present invention, forming the electrically insulating electrode support layer may include forming a mold layer on the integrated circuit substrate and forming an etch stop layer on the mold layer. The lower mold layer may have a thickness of from about 5 to about 20 percent of the thicknesses of the lower mold layer, the etch stop layer and an upper mold layer combined.

In further embodiments of the present invention the first capacitor dielectric layer may have a thickness of from about 100 Å to about 200 Å and the second capacitor dielectric layer may have a thickness of about 10 Å to about 40 Å. The U-shaped lower electrode may have a thickness of from about 200 to about 500 Å.

DETAILED DESCRIPTION OF THE INVENTION

Figure 1:
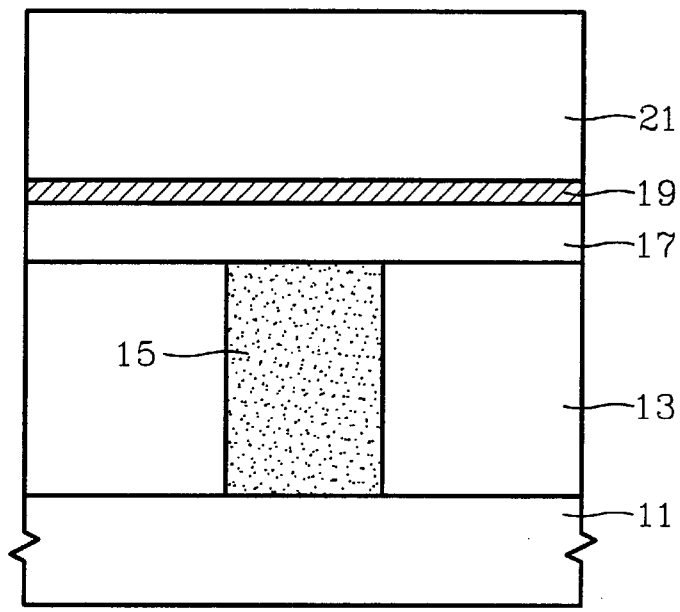
FIGS. 1 through 4 are cross-sectional views of intermediate structures that illustrate a conventional method of fabricating an integrated circuit capacitor.
Figure 2:
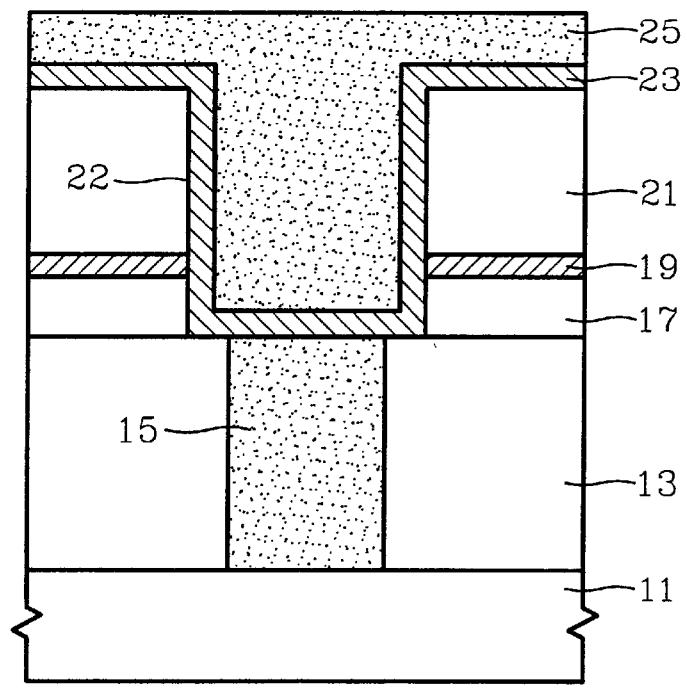
Figure 3:
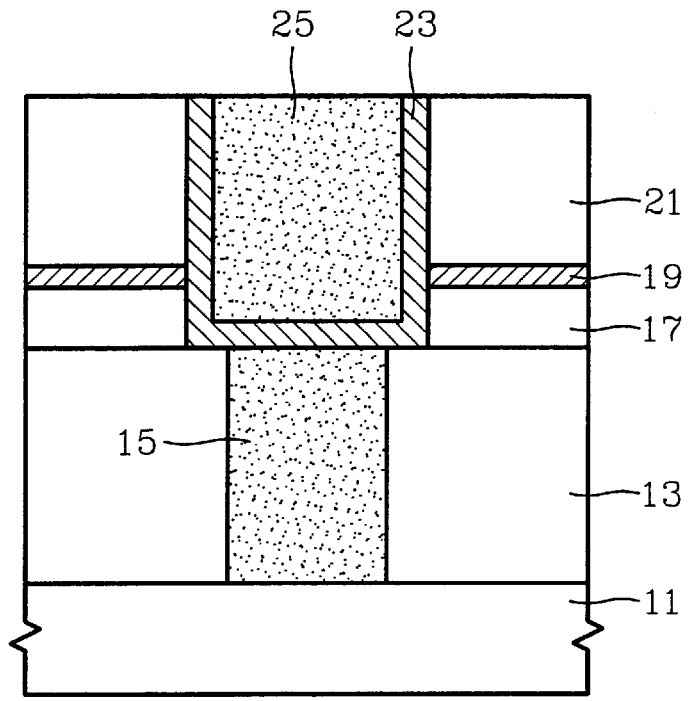
Figure 4:
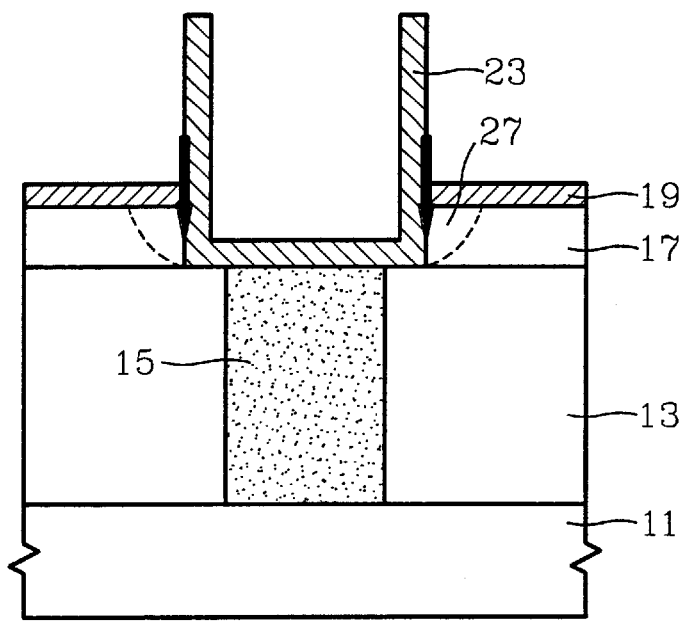

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. Like reference numerals refer to like elements throughout.

Embodiments of the present invention will now be described in detail below with reference to FIGS. 5 through 11, which illustrate various embodiments of the present invention, and various processes of fabricating embodiments of the present invention. As discussed in detail below, according to embodiments of the present invention, an integrated circuit capacitor is provided that includes a dielectric layer between a U-shaped lower electrode and a support layer. The placement of the dielectric layer between the U-shaped lower electrode and the support layer may reduce the likelihood that the lower mold layer and the insulating layer will be damaged during the fabrication process.

Figure 5:
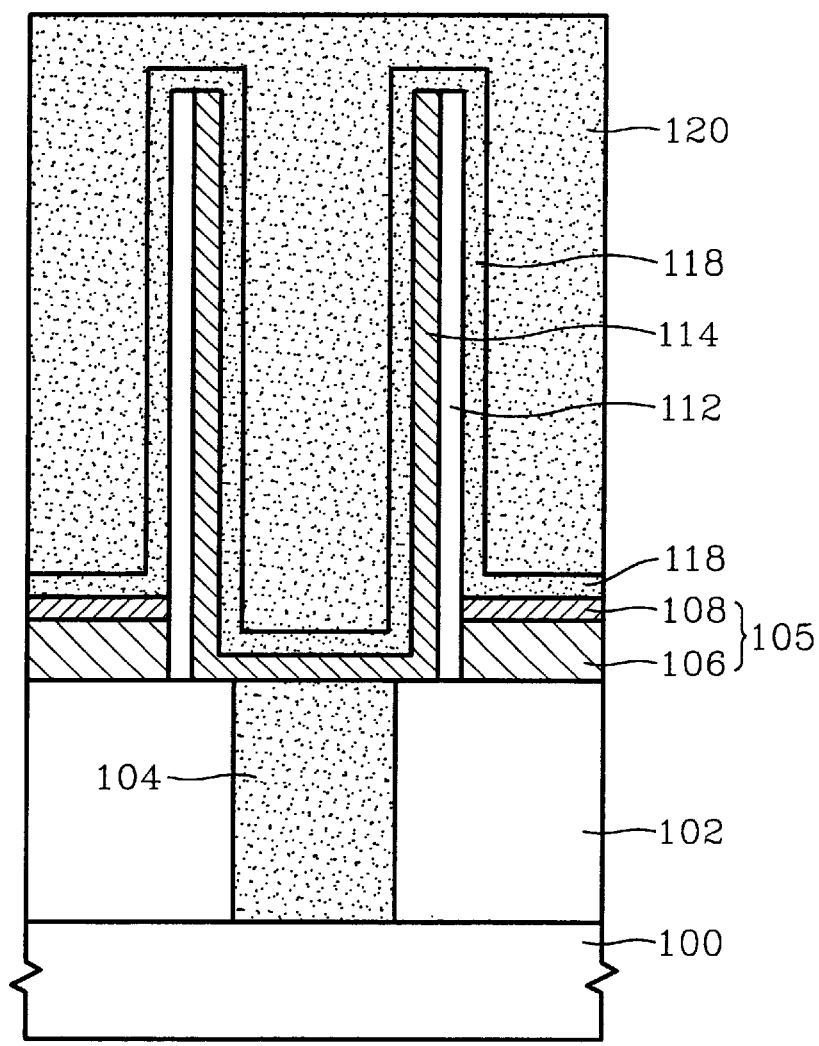
FIG. 5 is a cross-sectional view of an integrated circuit capacitor according to embodiments of the present invention.

Now referring to FIG. 5, a cross-sectional view of an integrated circuit capacitor according to embodiments of the present invention will be discussed. As illustrated in FIG. 5, an insulating layer 102 is provided on an integrated circuit substrate 100. A plug 104 is provided in a contact hole in the insulating layer 102. The plug 104 may include, for example, titanium nitride (TiN). A lower mold layer 106 is provided on the insulating layer 102 and a etch stop layer 108 is provided on the lower mold layer 106. The lower mold layer 106 may be formed to provide support for a lower electrode during the fabrication process. It will be understood that the lower mold layer 106 may not be formed if it appears to a person skilled in the art that the lower mold layer is not necessary. The etch stop layer 108 may protect the lower mold layer 106 and/or the insulating layer 102 during the fabrication process. The lower mold layer 106 and the etch stop layer 108 together may be termed an electrically insulating electrode support layer 105 or just support layer.

The lower mold layer 106 and the etch stop layer 108 have an opening therein that exposes at least a portion of the plug 104. In other embodiments of the present invention, the opening in the lower mold layer 106 and the etch stop layer 108 may expose all or substantially all of the plug 104. The lower mold layer 106 may include, for example, silicon oxide. The etch stop layer 108 may include, for example, a silicon nitride layer, a tantalum oxide layer, or a combination of both.

A U-shaped lower electrode 114, which is electrically connected to the plug 104, is provided in the opening in the lower mold layer 106 and the etch stop layer 108. The U-shaped lower electrode 114 may include, for example, precious metal layers of a platinum group, such as a platinum (Pt) layer, a ruthenium (Ru) layer, and a iridium (Ir) layer. A first capacitor dielectric layer 112 is provided on an outer portion of the U-shaped lower electrode 114. As illustrated in FIG. 5, the first capacitor dielectric layer 112 is provided between the outer portion of the U-shaped lower electrode 114 and an inner sidewall of the opening in the support layer 105, for example, the lower mold layer 106 and the etch stop layer 108. It will be understood that although the support layer is described herein as including the lower mold layer and the etch stop layer, the present invention should not be limited to this configuration.

The first capacitor dielectric layer 112 is provided so that it adheres well to the etch stop layer 108, thus, reducing the probability that the lower mold layer 106 and the insulating layer 102 will be damaged during the fabrication process. Thus, embodiments of the present invention provide advantages over conventional integrated circuit capacitors. The first capacitor dielectric layer 112 is typically an amorphous layer such that the number of voids on the interface between the etch stop layer pattern 108 and the spacer 112 are reduced. The first capacitor dielectric layer 112 may include, for example, a tantalum oxide layer.

A second capacitor dielectric layer 118 is provided on the surfaces of the U-shaped lower electrode 114, the first capacitor dielectric layer 112, and the etch stop layer pattern 108, such that a first capacitor dielectric layer extends between the outer portion of the U-shaped lower electrode and the second capacitor dielectric. The second capacitor dielectric layer 118 may include, for example, a dielectric material including tantalum oxide, aluminum oxide ($Al_2O_3$), and/or Hafnium Oxide ($HfO_2$). layer. An upper electrode 120 is provided on the second capacitor dielectric layer 118 using, for example, precious metal layers of a platinum group, such as a platinum (Pt) layer, a ruthenium (Ru) layer, and an iridium (Ir) layer.

It will be understood that the terms first and second are used herein to distinguish one capacitor dielectric layer from another and should not be viewed as limiting the embodiments of the present invention described herein. Thus, the first and second capacitor dielectric layers discussed above could be termed the second and first capacitor dielectric layers, respectively, without affecting the functionality of embodiments of the present invention as described herein.

Figure 6:
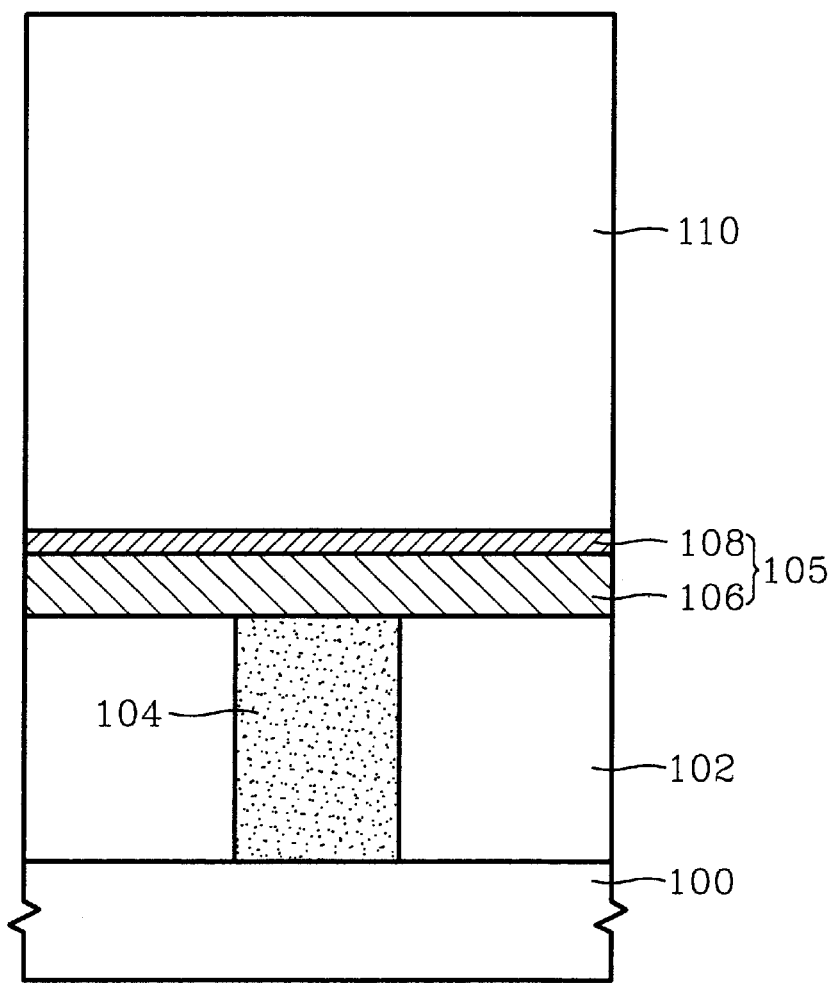
FIGS. 6 through 11 are cross-sectional views of intermediate structures that illustrate methods of fabricating integrated circuit capacitors according to embodiments of the present invention.

Now referring to FIGS. 6 through 11, cross-sectional views of intermediate structures that illustrate methods of fabricating integrated circuit capacitors according to embodiments of the present invention will be discussed in detail. As illustrated in FIG. 6, an insulating layer 102 is formed on a integrated circuit substrate 100. The integrated circuit substrate 100 may be, for example, a silicon substrate, and the insulating layer 102 may be, for example, a silicon oxide layer. A plug 104 is formed in the insulating layer 102. The plug 104 may include, for example, titanium nitride (TiN). A lower mold layer 106 is formed on the insulating layer 102 and the plug 104. The lower mold layer 106 may include, for example, a silicon oxide layer, and may provide support that may be useful during the fabrication process. It will be understood that the lower mold layer 106 may not be formed if it appears to a person having skill in the art that it is not needed.

An etch stop layer 108 is formed on the lower mold layer 106 and may protect the lower mold layer 106 and the insulating layer 102 from being damaged during the fabrication process. The etch stop layer 108 may include, for example, a silicon nitride layer, a tantalum oxide layer, or a combination of both. The lower mold layer 106 and the etch stop layer 108 together may be termed an electrically insulating electrode support layer 105 or just support layer.

Figure 7:
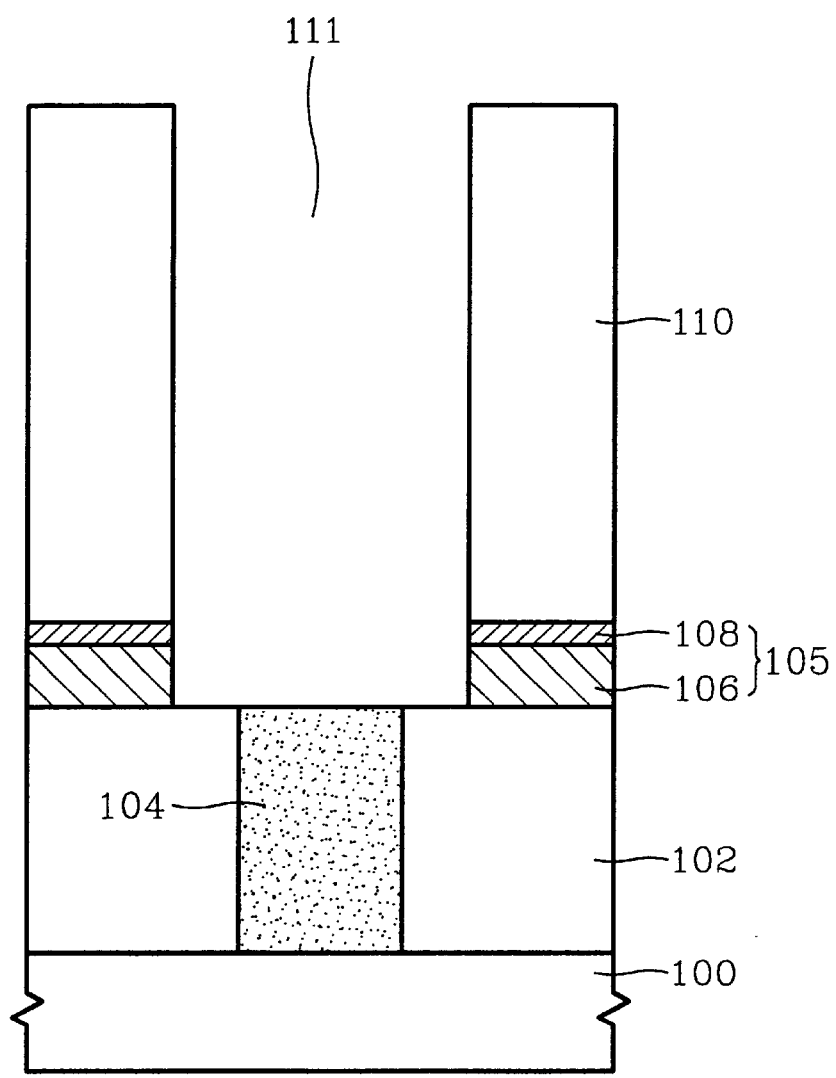

An upper mold layer 110 is formed on the etch stop layer 108. The upper mold layer 110 may include, for example, a silicon oxide layer. Typically, the lower mold layer 106 has a thickness of from about 5 percent to about 20 percent of the thicknesses of the lower mold layer 106, the etch stop layer 108, and the upper mold layer 110 combined. As illustrated in FIG. 7, the upper mold layer 110, the etch stop layer 108, and the lower mold layer 106 are patterned to form an opening 111 that exposes at least a portion of the plug 104. In other embodiments of the present invention, the opening may expose all or substantially all of the plug 104.

Figure 8:
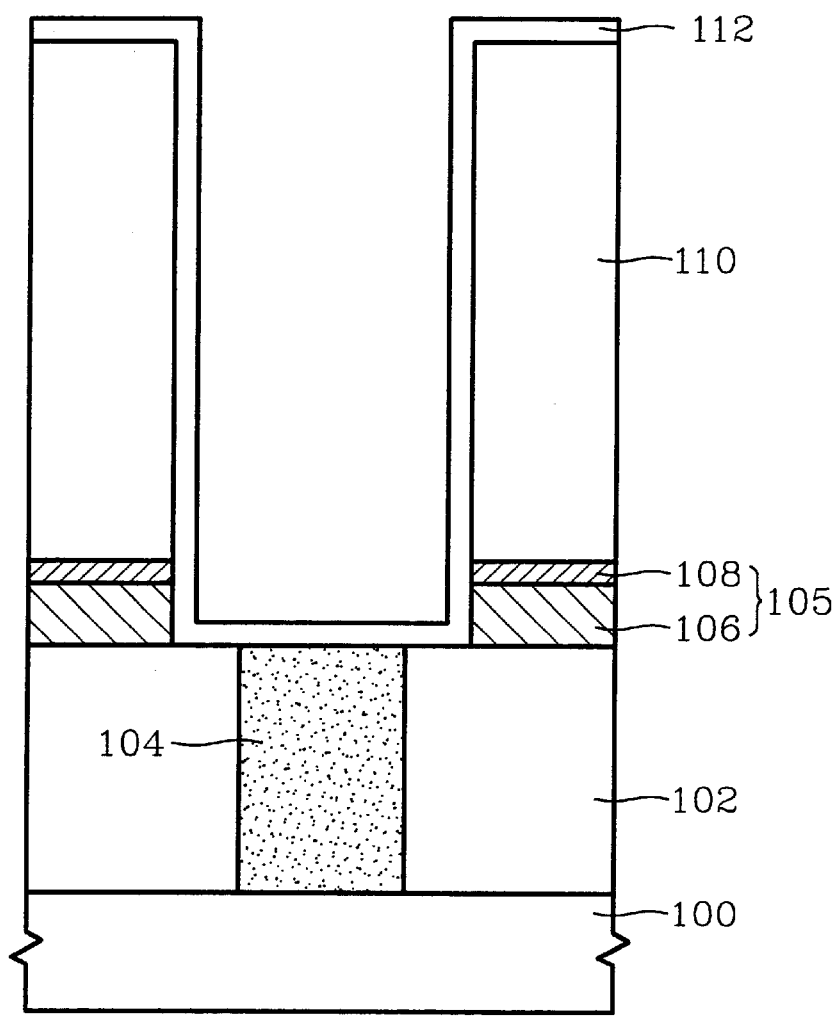

As illustrated in FIG. 8, a first capacitor dielectric layer 112 is formed over the entire surface of the integrated circuit device. The first capacitor dielectric layer 112 is typically an amorphous layer that adheres well to the etch stop layer 108 and a subsequent U-shaped lower electrode, thus, the number of voids on the interface between the etch stop layer 108 and the first capacitor dielectric layer 112 may be reduced. The first capacitor dielectric layer 112 may include, for example, a dielectric material including tantalum oxide that may not be etched by an oxide etchant. The thickness of the first capacitor dielectric layer 112 is typically minimized to prevent an increase in capacitance. For example, if a second capacitor dielectric layer has a thickness of from about 100 to about 200 D, the thickness of the first capacitor dielectric layer 112 is typically from about 10 to about 40 D.

Figure 9:
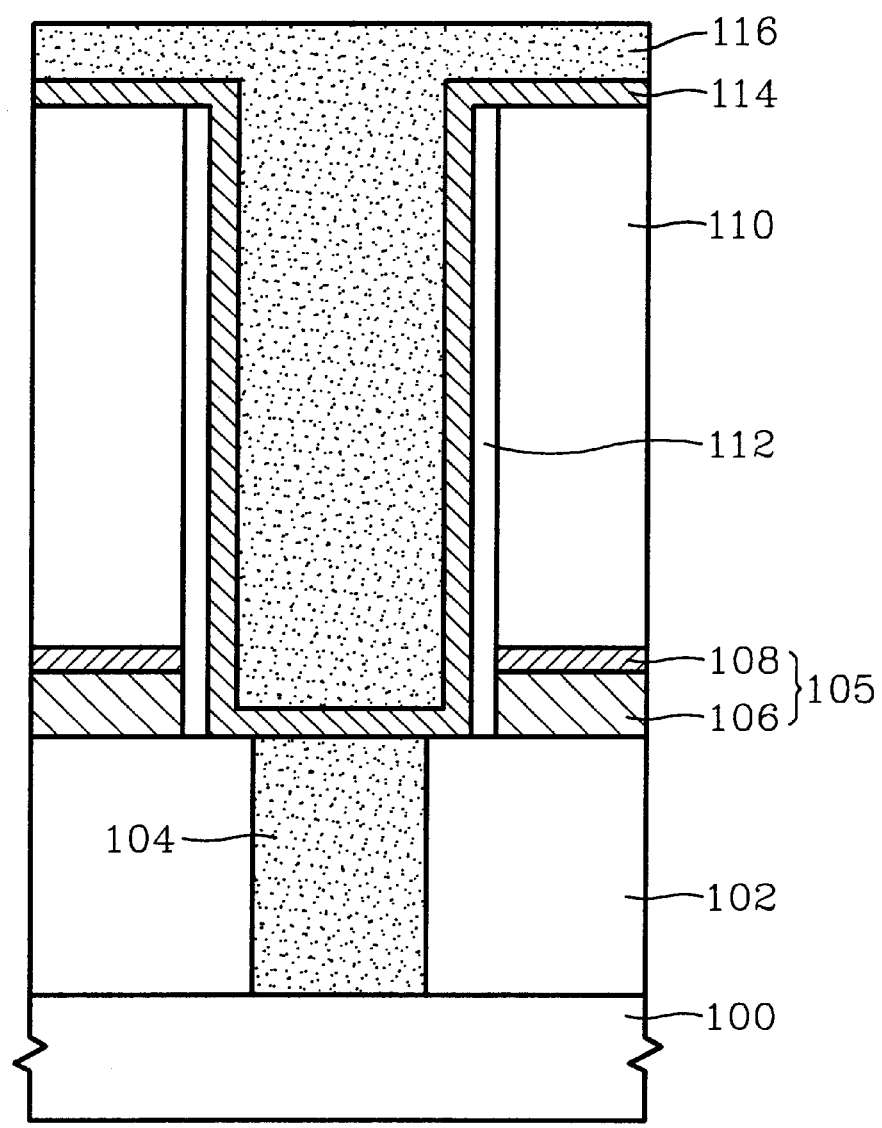

As illustrated in FIG. 9, the first capacitor dielectric layer 112 is etched back so that the first capacitor dielectric layer 112 remains primarily on an inner sidewall of the opening 111. In other words, the first capacitor dielectric layer is essentially removed from the surface of the upper mold layer 110 and from a floor of the opening 111 such that at least a portion of the plug 104 is exposed. In other embodiments of the present invention, the first capacitor dielectric layer is removed so that all or substantially all of the plug 104 is exposed. Therefore, the first capacitor dielectric layer 112 may seal and protect the lower mold layer 106 in a subsequent process, for example, in removing the upper mold layer 110. The height of the first capacitor dielectric layer 112 may be adjusted to be at least higher than the etch stop layer 108 using an etch back process.

A conductive layer 114, i.e. a U-shaped lower electrode, is formed on the surface of the integrated circuit device as illustrated in FIG. 9. The conductive layer 114 is formed on the inner surface of the first capacitor dielectric layer 112, on the surface of the plug 104, and on the surface of the upper mold layer pattern 110. The conductive layer 114 may be formed using, for example, precious metal layers of a platinum group, such as a platinum (Pt) layer, a ruthenium (Ru) layer and an iridium (Ir) layer. The conductive layer 114 for the U-shaped lower electrode may have a thickness of from about 200 to about 500 D. The conductive layer 114 for the U-shaped lower electrode may be formed using a chemical vapor deposition (CVD) method having excellent step coverage.

The conductive layer 114 for the U-shaped lower electrode formed in the opening 111 is formed on the first capacitor dielectric layer 112, for example, on a tantalum oxide layer. Therefore, the conductive layer 114 for the U-shaped lower electrode may have a better surface morphology than it would have if formed on a silicon oxide layer or a silicon nitride layer. In other words, the first capacitor dielectric layer 112 may promote a nucleation when forming the conductive layer for the U-shaped lower electrode, thereby improving the surface morphology of the conductive layer for the U-shaped lower electrode.

Figure 10:
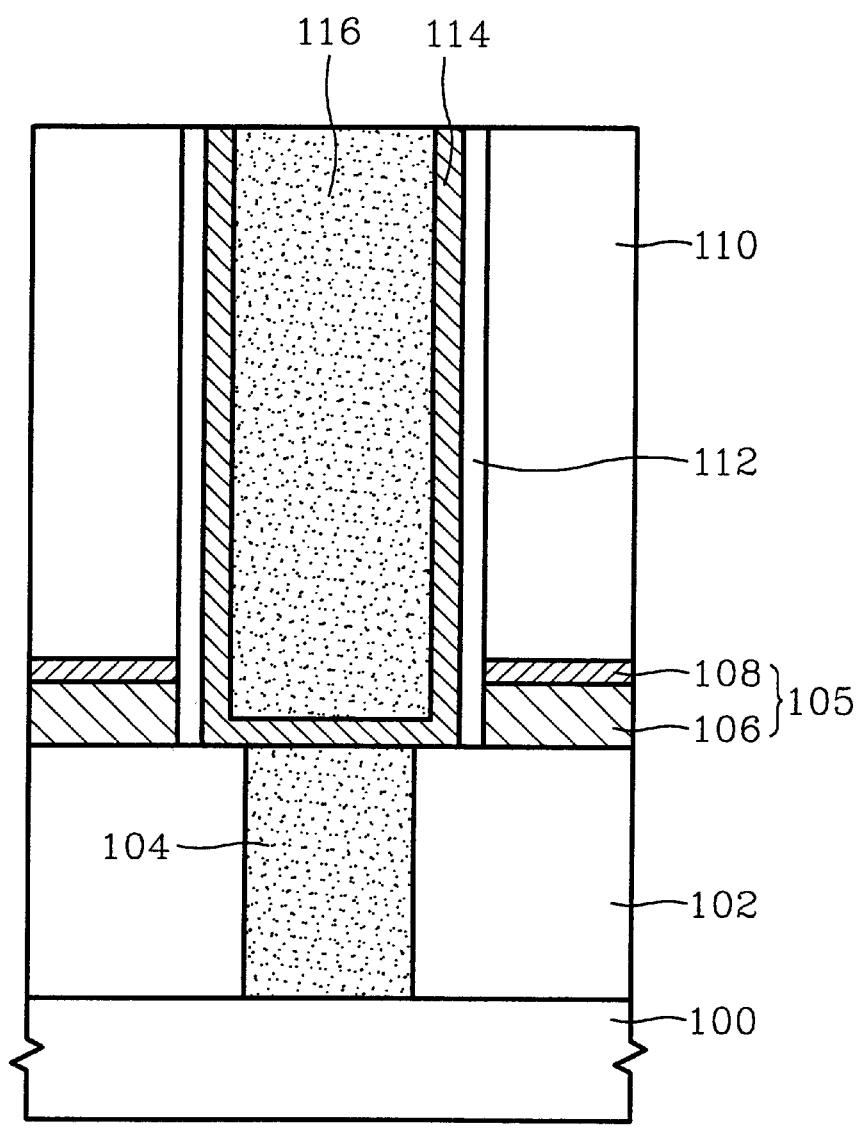

A sacrificial layer 116 is formed over the surface of the integrated circuit substrate device and may fill the contact hole 111. The sacrificial layer 116 may be formed using, for example, a photoresist layer or a silicon oxide layer. As illustrated in FIG. 10, the sacrificial layer 116 and the conductive layer 114 for the U-shaped lower electrode are sequentially etched using the surface of the upper mold layer 110 as an etch stop point. Finally, the U-shaped lower electrodes 114 of a plurality of capacitors may be is isolated from one another.

Figure 11:
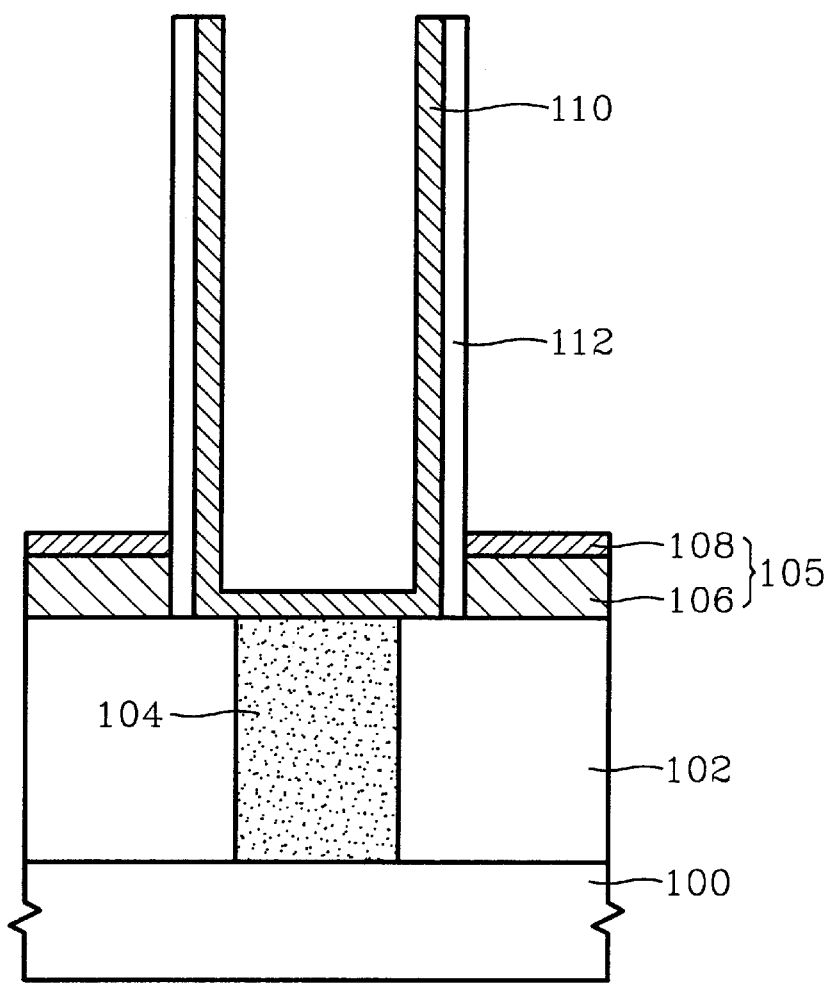

As illustrated in FIG. 11, the sacrificial layer pattern 116 and the upper mold layer pattern 110 are removed by a wet etching method using the etch stop layer 108 and the first capacitor dielectric layer 112 as etch stop layers. As a result, a U-shaped lower electrode 114 of a capacitor is formed. The wet etch process for the sacrificial layer pattern 116 and the upper mold layer pattern 110 is performed for from about tens to about hundreds of seconds using an oxide etchant, for example, a buffered oxide etchant (BOE). At this time, adhesion between the first capacitor dielectric layer 112 and the etch stop layer pattern 108 may be improved and the number of voids in between may be reduced. Therefore, the oxide etchant may not penetrate into the lower mold layer 106 or the insulating layer 102. Consequently, the lower mold layer 106 and/or the insulating layer 102 may not be damaged when wet etching the sacrificial layer 116 and the upper mold layer 110. In some embodiments of the present invention, the sacrificial layer 116 and the upper mold layer 110 are simultaneously removed. In other embodiments of the present invention, the sacrificial layer 116 and the upper mold layer 110 may be separately removed.

As illustrated in FIG. 5, a second capacitor dielectric layer 118 is formed over the surface of the integrated circuit device. The second capacitor dielectric layer 118 may have a thickness of from about 100 to about 200 D and may be, for example, a tantalum oxide layer. An integrated circuit capacitor is completed by forming an upper electrode 120 on the second dielectric layer 118. The upper electrode 120 may be formed using precious metal layers of, for example, a platinum group, such as a platinum (Pt) layer, a ruthenium (Ru) layer, and an iridium (Ir) layer. The upper electrode 120 may have a thickness of from about 300 to about 1000 D. The upper electrode 120 may have excellent step coverage and may be formed using a chemical vapor deposition (CVD) method.

As discussed above, embodiments of the present invention can provide integrated circuit capacitors having a capacitor dielectric layer between the U-shaped lower electrode and a support layer. The presence of the capacitor dielectric layer may make it possible to improve adhesion between a U-shaped lower electrode and an etch stop layer of a capacitor. Consequently, when an upper mold layer is removed during a fabrication process, damage to a lower mold oxide layer pattern and/or an insulating layer may be reduced or possibly prevented.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an integrated circuit capacitor comprising:

forming an electrically insulating electrode support layer having an opening therein, on an integrated circuit substrate;

forming a U-shaped lower electrode in the opening;

forming a first capacitor dielectric layer extending on an inner surface and outer portion of the U-shaped lower electrode;

forming a second capacitor dielectric layer extending between the outer portion of the U-shaped lower electrode and the first capacitor dielectric and also extending between the outer portion of the U-shaped lower electrode and an inner sidewall of the opening; and forming an upper electrode on the first capacitor dielectric layer.

2. A method according to claim 1, wherein forming the electrically insulating electrode support layer comprises:

forming a mold layer on the integrated circuit substrate; and forming an etch stop layer on the mold layer.

3. A method according to claim 2, wherein forming the lower mold layer comprises forming the lower mold layer of silicon oxide and wherein forming the etch stop layer comprises forming the etch stop layer of at least one of silicon nitride and/or tantalum oxide.

4. The method of claim 2, wherein the lower mold layer comprises a thickness of from about 5 to about 20 percent of the thicknesses of the lower mold layer, the etch stop layer and an upper mold layer combined.

5. The method of claim 1, wherein the first capacitor dielectric layer has a thickness of from about 100 Å to about 200 Å and wherein the second capacitor dielectric layer has a thickness of about 10 Å to about 40 Å.

6. A method according to claim 1, wherein forming the first capacitor dielectric layer comprises forming the first capacitor dielectric layer of tantalum oxide, aluminum oxide ($Al_2O_3$), and/or Hafnium Oxide ($HfO_2$).

7. A method according to claim 1, wherein forming the second capacitor dielectric layer comprises forming the second capacitor dielectric layer of a dielectric material that is not etched by an oxide etchant.

8. A method according to claim 1, wherein the U-shaped lower electrode has a thickness of from about 200 Å to about 500 Å.

9. A method of fabricating an integrated circuit capacitor comprising:

forming an electrically insulating electrode support layer on the integrated circuit substrate;

forming an upper mold layer on the support layer;

forming an opening in the support layer and the upper mold layer, the opening having a sidewall and a floor;

forming a first capacitor dielectric extending on the upper mold layer, the sidewall and the floor;

removing the first capacitor dielectric layer from the upper mold layer and from at least a portion of the floor;

forming a U-shaped lower electrode in the opening, the first capacitor dielectric layer extending between the outer portion of the U-shaped lower electrode and the sidewall of the opening;

removing the upper mold layer using a wet etch;

forming a second capacitor dielectric layer over the surface of the integrated circuit substrate; and forming an upper electrode on the second capacitor dielectric layer.

* * * * *